United States Patent
Gregor et al.

(10) Patent No.: US 9,004,107 B2
(45) Date of Patent: Apr. 14, 2015

(54) METHODS AND APPARATUS FOR ENHANCED GAS FLOW RATE CONTROL

(75) Inventors: Mariusch Gregor, Gilroy, CA (US); John W. Lane, San Jose, CA (US); Michael Robert Rice, Pleasanton, CA (US); Justin Hough, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 308 days.

(21) Appl. No.: 13/591,212

(22) Filed: Aug. 21, 2012

(65) Prior Publication Data

US 2014/0053912 A1   Feb. 27, 2014

(51) Int. Cl.
  *F16K 11/20* (2006.01)
  *G05D 16/20* (2006.01)
  *C23C 16/455* (2006.01)
  *G05D 7/06* (2006.01)

(52) U.S. Cl.
  CPC ...... *G05D 16/2006* (2013.01); *C23C 16/45561* (2013.01); *G05D 7/0664* (2013.01)

(58) Field of Classification Search
  USPC ....... 137/884; 118/715; 438/935; 700/44, 45, 700/282; 73/1.35
  See application file for complete search history.

(56) References Cited

U.S. PATENT DOCUMENTS

| | | | |
|---|---|---|---|
| 6,333,272 B1 | 12/2001 | McMillin et al. | |
| 6,848,470 B2 * | 2/2005 | Ohmi et al. | 137/487.5 |
| 7,072,743 B2 * | 7/2006 | Shajii et al. | 700/282 |
| 7,360,551 B2 | 4/2008 | Lull et al. | |
| 7,621,290 B2 | 11/2009 | Ding et al. | |
| 7,673,645 B2 | 3/2010 | Ding et al. | |
| 7,706,925 B2 | 4/2010 | Ding et al. | |
| 7,930,045 B2 * | 4/2011 | Cheng | 700/45 |
| 8,055,372 B2 * | 11/2011 | Kataoka et al. | 700/109 |
| 8,074,677 B2 | 12/2011 | Gold et al. | |
| 8,131,400 B2 * | 3/2012 | Smirnov | 700/282 |
| 8,195,312 B2 * | 6/2012 | Smirnov et al. | 700/45 |
| 8,201,989 B2 * | 6/2012 | Itoh et al. | 366/152.1 |
| 8,321,060 B2 * | 11/2012 | Smirnov et al. | 700/282 |
| 2002/0189681 A1 * | 12/2002 | Linthorst | 137/487.5 |
| 2007/0168057 A1 * | 7/2007 | Blevins et al. | 700/53 |
| 2007/0240778 A1 | 10/2007 | Bassi et al. | |
| 2007/0276545 A1 * | 11/2007 | Smirnov | 700/282 |
| 2009/0145484 A1 | 6/2009 | Mizusawa | |
| 2010/0036534 A1 * | 2/2010 | Ding | 700/282 |
| 2011/0054702 A1 * | 3/2011 | Smirnov et al. | 700/282 |

OTHER PUBLICATIONS

International Search Report of International Application No. PCT/US13/54522 mailed Nov. 6, 2013.

* cited by examiner

Primary Examiner — John Fox
(74) Attorney, Agent, or Firm — Dugan & Dugan, PC

(57) ABSTRACT

The present invention provides methods and apparatus for controlling gas flow to a semiconductor-processing chamber. The invention includes deactivating ratio setpoint feedback control in a flow ratio controller; initiating gas flow through the flow ratio controller; moving valves of the flow ratio controller to a preset position based on a stored position when an upstream pressure reaches a stored upstream pressure value, wherein the stored position and the stored upstream pressure value were stored during a prior process run; determining that steady state flow ratio controller output flows have been reached; and activating ratio setpoint feedback control in the flow ratio controller. Numerous additional features are disclosed.

20 Claims, 5 Drawing Sheets

METHODS AND APPARATUS FOR ENHANCED GAS FLOW RATE CONTROL

FIELD OF THE INVENTION

The present invention generally relates to gas flow rate control for electronic device manufacturing, and more particularly is directed to methods and apparatus for enhancing gas flow rate control to be more precise.

BACKGROUND OF THE INVENTION

Semiconductor processing can be particularly sensitive to flow rate variations and perturbations. Thus, gas delivery systems for semiconductor processing chambers attempt to deliver steady flows at precise rates and pressures. Prior art gas delivery systems use flow-splitting methods to improve mix ratio accuracy, repeatability, and reproducibility in multi-injection point and multi-chamber architectures that share gas supplies. Flow splitting also reduces cost of the gas delivery system significantly in a number of applications. Flow splitting devices range from simple Y-piping to real time flow feedback ratio controllers (FRCs) which actively attempt to control the relative flow rates of gases dispensed via the FRC's output channels. However, as new technologies continue to achieve smaller critical dimensions, higher degrees of flow control precision are desirable. Thus, methods and apparatus are needed for enhancing gas flow rate control to be more precise.

SUMMARY OF THE INVENTION

Inventive methods and apparatus are provided for a method of controlling gas flow to a semiconductor-processing chamber. The method includes deactivating ratio setpoint feedback control in a flow ratio controller; initiating gas flow through the flow ratio controller; moving valves of the flow ratio controller to a preset position based on a stored position when an upstream pressure reaches a stored upstream pressure value, wherein the stored position and the stored upstream pressure value were stored during a prior process run; determining that steady state flow ratio controller output flows have been reached; and activating ratio setpoint feedback control in the flow ratio controller.

In some embodiments, the invention provides a flow ratio controller assembly. The assembly includes a controller; an input gas line; a pressure sensor coupled to the input gas line and adapted to sense an up-stream gas pressure in the input gas line; a fan-out manifold having an input coupled to the input gas line and a plurality of outputs; a plurality of mass flow sensors, each mass flow sensor operatively coupled to a different one of the plurality of outputs of the fan-out manifold and adapted to sense gas flow through a respective output; and a plurality of adjustable valves, each valve operatively coupled to a different one of the plurality of outputs of the fan-out manifold and adapted to control gas flow through a respective output. The controller is operatively coupled to the plurality of adjustable valves and adapted to control a position of each of the valves in order to set the valves to a predetermined position based on a stored position.

In yet other embodiments, the invention provides a gas delivery system for one or more processing chambers. The system includes a gas supply panel including a plurality of mass flow controllers; a flow ratio controller assembly having an input gas line coupled to the gas supply panel, the flow ratio controller assembly including a plurality of output gas lines adapted to be coupled to one or more processing chambers. The flow ratio controller assembly includes a controller; a pressure sensor coupled to the input gas line and adapted to sense an up-stream gas pressure in the input gas line; a fan-out manifold having an input coupled to the input gas line and the plurality of output gas lines; a plurality of mass flow sensors, each mass flow sensor operatively coupled to a different one of the plurality of output gas lines of the fan-out manifold and adapted to sense gas flow through a respective output gas lines; and a plurality of adjustable valves, each valve operatively coupled to a different one of the plurality of output gas lines of the fan-out manifold and adapted to control gas flow through a respective output gas line. The controller is operatively coupled to the plurality of adjustable valves and adapted to control a position of each of the valves in order to set the valves to a predetermined position based on a stored position.

Numerous other aspects are provided. Other features and aspects of the present invention will become more fully apparent from the following detailed description, the appended claims and the accompanying drawings.

DETAILED DESCRIPTION

The present invention provides improved methods and apparatus for controlling gas flow into processing chambers. In particular, the present invention reduces the settling time to find the flow rate into a processing chamber that provides the desired amount of gas with the least amount of perturbations in the flow. Prior art methods of improving gas flow control do not attempt to achieve steady state flow through flow ratio controllers. By reducing the settling time according to the present invention, transient flow is eliminated or minimized and tighter process control is enabled since gas delivery to the chamber is better defined and the residence time transient is significantly reduced.

Feedback-based control by itself has some inherent limitations. No corrective action is taken until after a deviation in the controlled variable occurs. Thus, perfect control, where the controlled variable does not deviate from the set point during disturbance or set-point changes, is theoretically impossible. Feedback control does not provide predictive control action to compensate for the effects of known (e.g., anticipatable) or measurable disturbances. In some cases where process recipes have tight tolerances, feedback control may not be satisfactory for processes. If a significant or repeated perturbation occurs, the process may operate in a transient state for an extended period and not attain the desired steady state quickly enough.

The present invention uses feed forward information from prior processing runs to switch, at the appropriate time, from using a conventional flow ratio setpoint feedback controller to directly setting the valve openings of the flow controller to a predetermined position based on the prior processing runs.

The present invention also includes a novel flow ratio controller (FRC) that can operate in two different modes to implement the methods of the present invention. In the feedback mode, the FRC valves are continually adjusted by the controller based on sensed flow to achieve a desired flow ratio based on a specified setpoint. In the feed forward mode, the FRC valves are set to previously stored positions determined during prior processing runs. Thus, in some embodiments, the novel FRC of the present invention may include both (1) mass flow sensors to facilitate operation in the feedback mode (e.g., repeatedly adjusting the valve positions based on the feedback data) and (2) valve position sensors and memory for detecting and storing valve positions from prior process runs to facilitate operation in the feed forward mode (e.g., setting the valves to a final position based on the feed forward data). In addition, the novel FRC may include a plurality of valves that can both (1) be adjusted relative to each other to seek positions that achieve a desired flow ratio and (2) be set to absolute positions based on previously stored positions.

Figure 1:
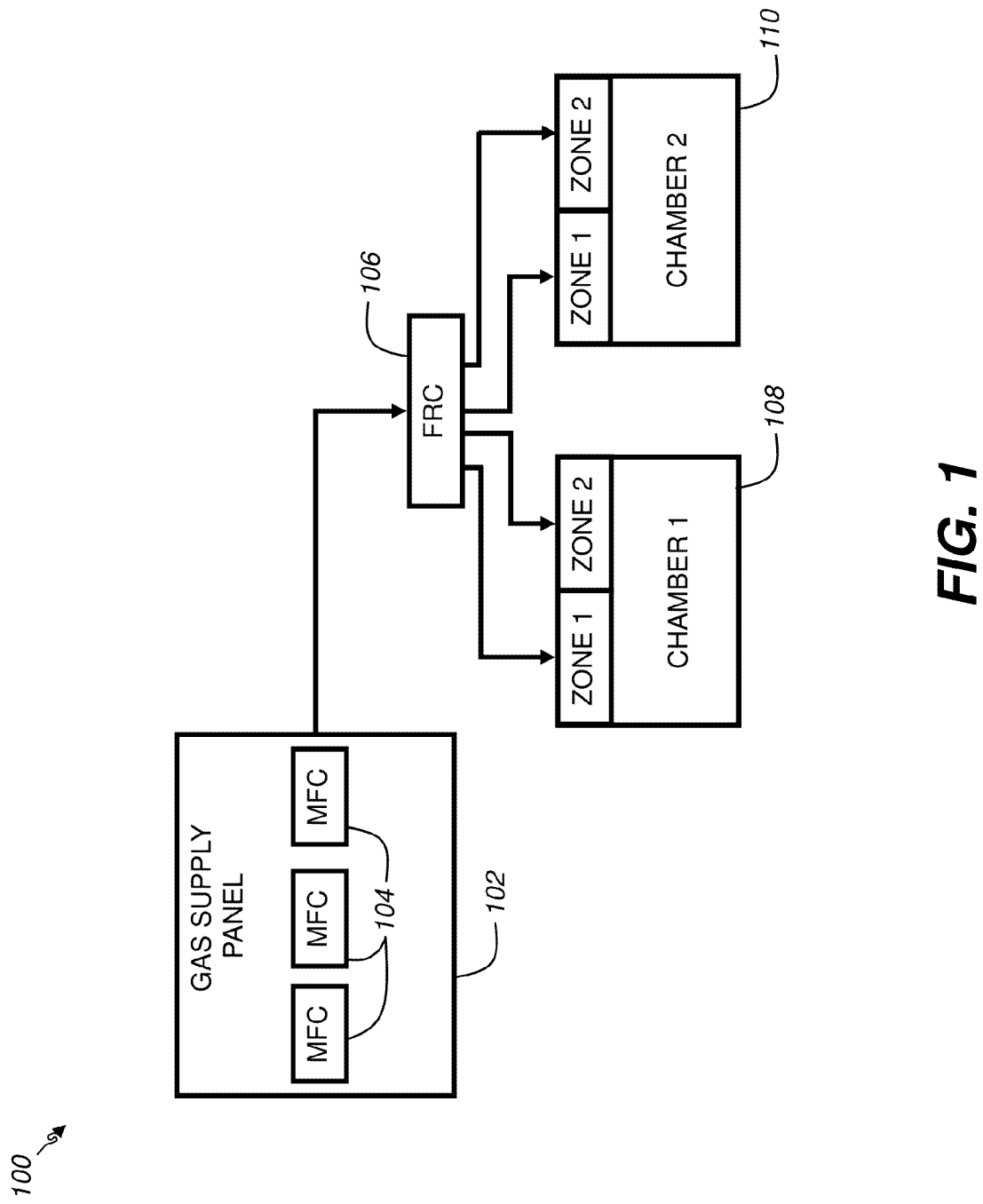
FIG. 1 is a schematic block diagram depicting an example gas delivery system according to some embodiments of the present invention.

Turning to FIG. 1, an example gas delivery system 100 according to the present invention is depicted. The system 100 includes a gas supply panel 102 which includes a plurality of mass flow controllers (MFC) 104 (only three are represented). The MFCs 104 are in fluid communication with the novel flow ratio controller (FRC) assembly 106 of the present invention. Depending on the process recipes to be performed during processing, the number of different gases supplied to the FRC 106 from the MFCs 104 will vary. The FRC assembly 106 is coupled to one or more processing chambers 108, 110 via a manifold of output lines. In some embodiments, the processing chambers 108, 110 may be adapted to receive gases in more than one zone within the processing chambers 108, 110 and thus the manifold may include multiple lines feeding a single chamber 108, 110. Although not shown in FIG. 1, the various components of the system 100 may include controllers, sensors, meters, and/or connections to a central control system. Other numbers of mass flow controllers, zones, chambers, etc., may be employed.

Figure 2:
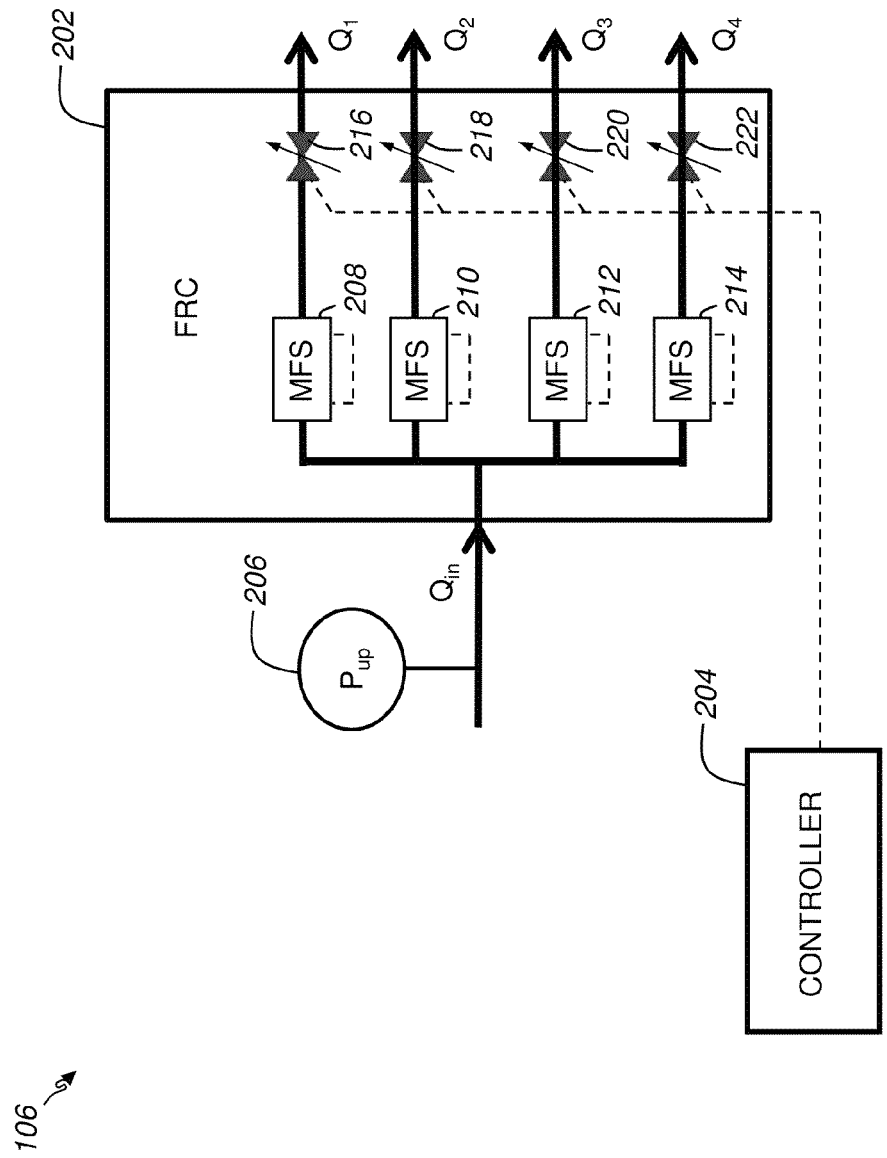
FIG. 2 is a schematic block diagram depicting an example flow feedback ratio controller (FRC) according to some embodiments of the present invention.

FIG. 2 depicts details of an example flow feedback ratio controller (FRC) assembly 106 according to some embodiments of the present invention. The FRC assembly 106 includes a FRC 202 that is operated under programmatic control of a controller 204. Line pressure sensor 206 provides a reading of the up-stream line pressure $P_{up}$ of the gas coming from the MFCs 104 in the gas supply panel 102. An input line $Q_{in}$ is fed to a fan out manifold within the FRC 202 to split the gas flow between a plurality of mass flow sensors (MFS) 208, 210, 212, 214 (e.g., thermal MFS) also within the FRC 202. Each branch of the split gas line then leads to a respective adjustable valve 216, 218, 220, 222, via a respective process line or leg, under the control of the controller 204. The outputs of the adjustable valves 216, 218, 220, 222, $Q_1$ to $Q_4$ may be coupled to the inlets of the processing chambers 108, 110.

The controller 204 is adapted to both set a valve position of each of the adjustable valves 216, 218, 220, 222 and to read (and store) a current position of each of the adjustable valves 216, 218, 220, 222. The controller is also adapted to read and store the flow rate values of each of the MFSs 208, 210, 212, 214 and $P_{up}$ from the line pressure sensor 206. In some embodiments, the controller may be embodied as a discrete computer separate from the FRC 202, and, in some embodiments, the controller 204 may be integrated or embedded with the FRC 202. Other numbers of MFSs, valves, outputs, etc., may be employed. Any suitable MFSs and/or adjustable valves may be used.

Figure 3:
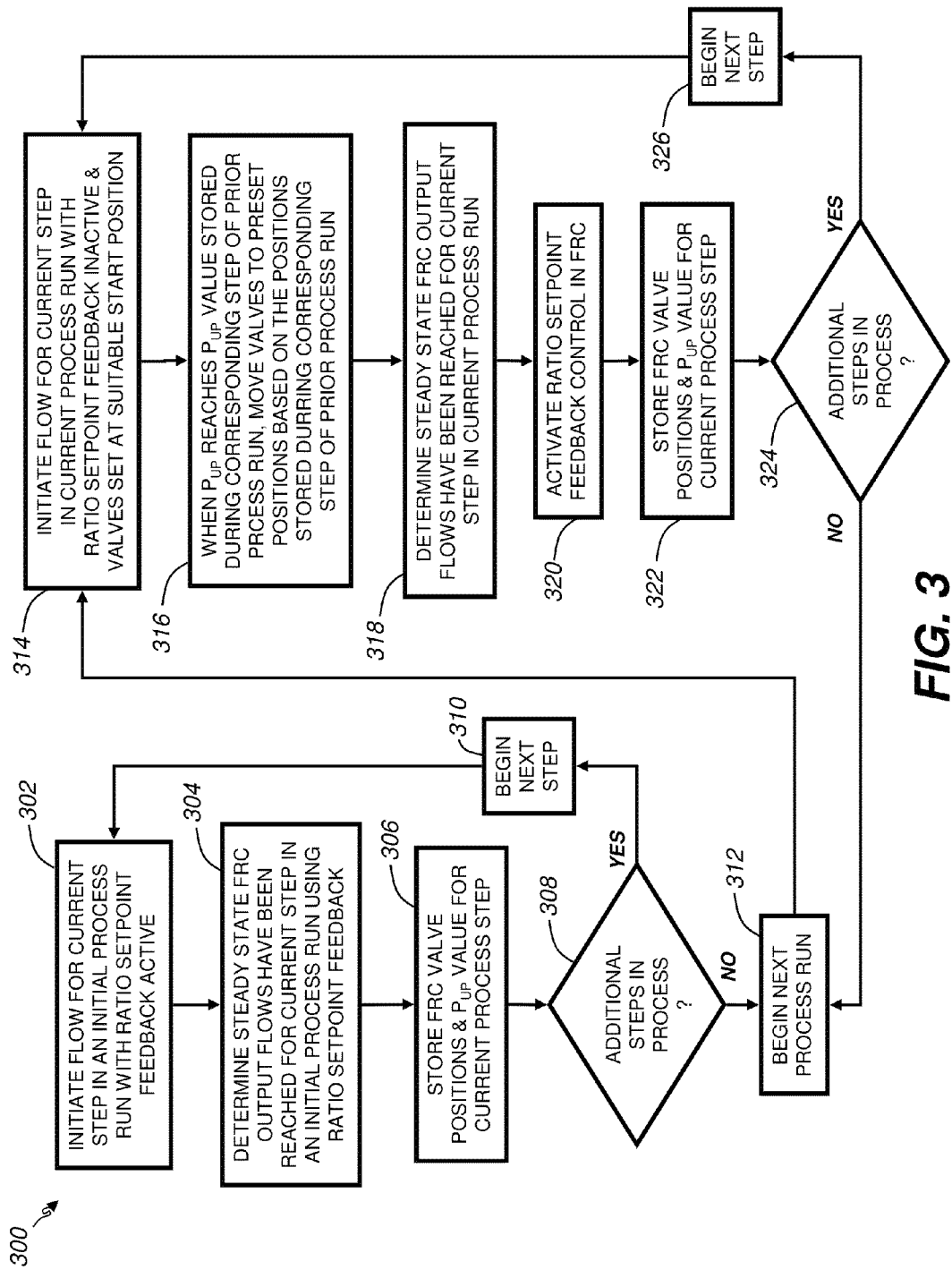
FIG. 3 is flowchart depicting an example method of controlling gas flow using a FRC according to some embodiments of the present invention.

FIG. 3 is flowchart depicting an example iterative method 300 of controlling gas flow using a FRC assembly 106 according to some embodiments of the present invention. Initially, the steps of a processing recipe are performed and values for $P_{up}$ and valve positions are stored when steady state flows are achieved, then the stored information is fed forward to subsequent runs of the process. The fed forward information is used to set the FRC valve positions when the $P_{up}$ is reached. In this manner, the FRC assembly 106 avoids having to use feedback methods for each new process run to hunt for the correct steady state valve positions.

Note that although the following example method 300 is described as a sequence of discrete steps, the invention is not so limited. The steps described below are merely for illustrative purposes to facilitate understanding of the invention. Any number of additional steps may be included, several steps may be omitted or combined, and any parts of the following steps may be broken into sub-steps. In addition, the particular sequence in which the steps are presented is merely to facilitate understanding of the invention and it should be understood that these steps, or any combination or sub-steps, may be performed in any practicable order.

The method 300 begins in Step 302 where gas flow is started for a current step in an initial process run. The FRC assembly 106 is set to operate with a ratio setpoint mode active where the assembly 106 is adapted to find valve positions that achieve the setpoint ratio using feedback. The FRC assembly 106 continues to adjust the valves 216, 218, 220, 222 in Step 304 until a steady state flow from the FRC assembly 106 is achieved for the current process step. In Step 306, the steady state flow FRC 202 valve positions are read and stored by the controller 204 along with the $P_{up}$ for the current process step. In Step 308, the method 300 determines if there are additional process steps in the initial process run. If so, flow proceeds to Step 310 where the next step in the initial process run begins (e.g., becomes the current step) and the above steps are repeated for the next process step. If the initial process run has completed, flow proceeds to Step 312 where the next process run begins.

Along with a number of other conventional steps (e.g., evacuating, purging, pumping-down), beginning the next process run in Step 312 involves removing the processed substrate(s) from the chamber(s) and loading new substrate(s) into the chamber(s). Once the substrate(s) have been replaced in the chamber(s) and the chamber(s) are ready to begin processing again, the method 300 moves to Step 314. In Step 314, gas flow for the current processing step is begun with the ratio setpoint feedback operating mode inactive. In other words, the valves 216, 218, 220, 222 are not adjusted at all. In some embodiments, the valves 216, 218, 220, 222 are set to a suitable start or initial position. The start position may be selected to allow a desired $P_{up}$ to be reached or to otherwise minimize perturbations in the gas flow. For example, in some embodiments, all of the valves 216, 218, 220, 222, being initially closed, may be opened (e.g., to a predetermined position such as to the same or a similar valve position). However, because line lengths, bends and overall volume of process lines may vary, in other embodiments, valves for process lines with larger line lengths, more bends and/or larger overall volumes may be opened first and/or more. In general, process performance may be used to determine the desired starting/initial position for the valves 216, 218, 220, 222.

With the gas flowing and the valves in the start position, the method 300 moves to Step 316 where $P_{up}$ is monitored. The FRC assembly 106 may be considered to be operating in a feed forward mode at this point. When $P_{up}$ reaches the steady state $P_{up}$ value stored during the prior process run (e.g., during the initial process run or a subsequent run but prior to the current run) that corresponds to the current step of the current run, the valves 216, 218, 220, 222 are moved to the valve positions that were stored when steady state flow was achieved during the prior process run. In other words, the valve positions from the prior run are fed forward to the current run. In step 318, the controller 204, using the MFSs 208, 210, 212, 214, determines when steady state FRC output flows have been achieved for the current step of the current process run. Once steady state flow has been achieved, in Step 320 the FRC assembly 106 is switched to the feedback operating mode by activating ratio setpoint feedback control where the valves are adjusted by the controller if it is detected that the flow ratio has varied from the setpoint. In Step 322, the current FRC valve positions and the value of Pup for the current process step are stored to be used with a subsequent process run.

In Step 324, the method 300 determines if there are additional process steps in the current process run. If so, flow proceeds to Step 326 where the next step in the current process run begins (e.g., becomes the current step) and steps 314 to 324 are repeated for the next process step. If the current process run has completed, flow returns to Step 312 where the next process run begins.

Figure 4:
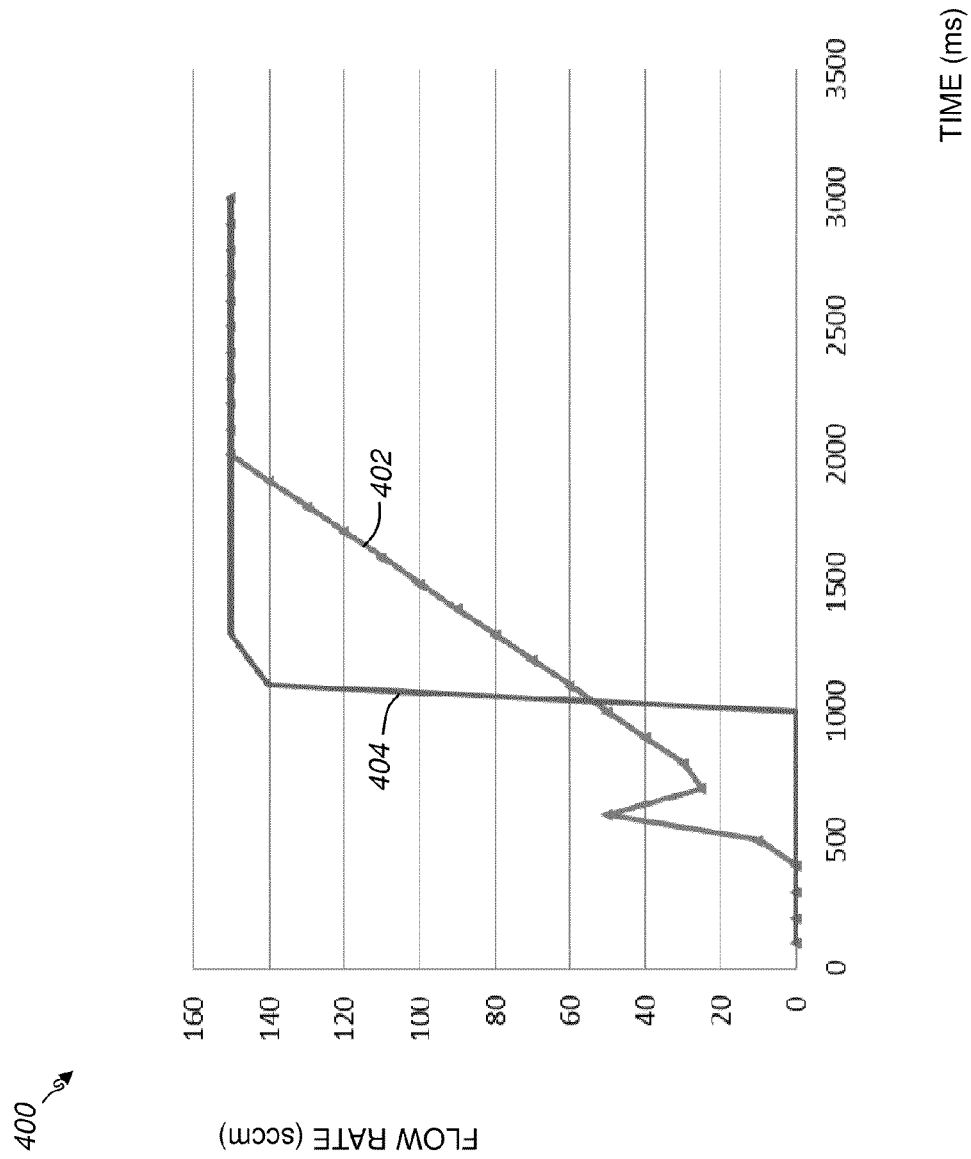
FIG. 4 is a graph depicting an example comparison of gas flow rate over time through a conventional FRC and gas flow rate over time through a FRC according to some embodiments of the present invention.

Turning now to FIG. 4, a graph 400 is provided depicting an example comparison of a gas flow rate over time through a conventional FRC (plot 402) and a gas flow rate over time through an FRC assembly according to some embodiments of the present invention (plot 404). The gas flow rate over time through a conventional FRC plot 402 includes a transient spike and a gradual transition to steady state flow indicated by the horizontal portion of the plot 402. In contrast, the gas flow rate over time through an FRC assembly according to some embodiments of the present invention (plot 404) appears to almost be a step function with a very fast (e.g., nearly vertical) transition from zero flow to steady state flow indicated by the horizontal portion of the plot 404. In some embodiments, steady state flow rates may be reached up to about 50% faster, in some cases up to about 75% faster, and in some cases up to about 100% faster with the FRC assembly of the present invention.

Figure 5:
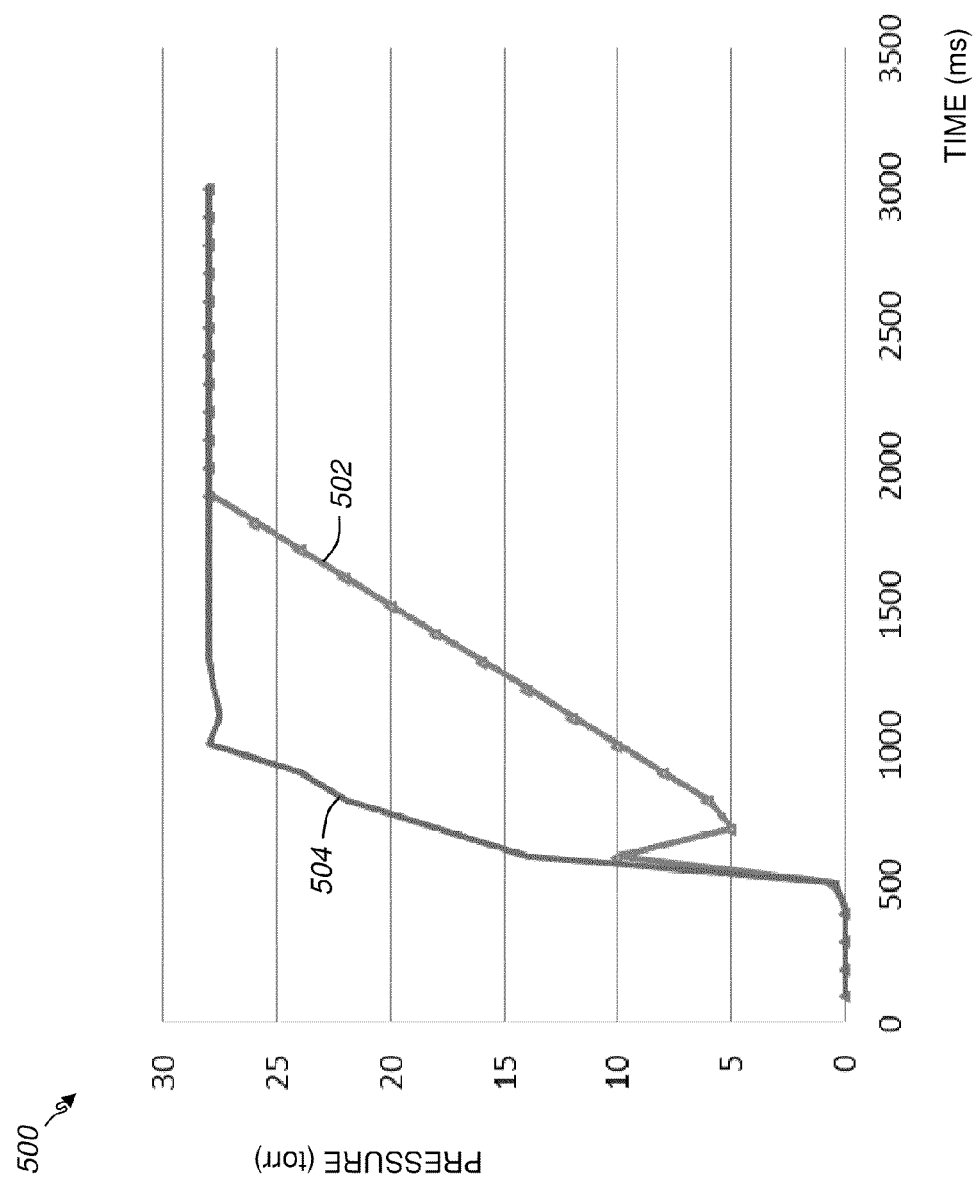
FIG. 5 is a graph depicting an example comparison of gas pressure over time upstream of a conventional FRC and gas pressure over time upstream of a FRC according to some embodiments of the present invention.

FIG. 5 illustrates a similar relatively high degree of precision control in a comparison of up-stream gas pressure response between a conventional feedback FRC and the FRC assembly according to some embodiments of the present invention. FIG. 5 is a graph 500 depicting an example comparison of gas pressure over time upstream of a conventional FRC (plot 502) and gas pressure over time upstream of a FRC according to some embodiments of the present invention (plot 504). As with the flow rate plots 402, 404, the up-stream pressure plots 502, 504 illustrate the higher level of precision achieved by the FRC according to some embodiments of the present invention. The up-stream gas pressure over time through a conventional FRC (plot 502) includes a transient spike and a gradual transition to steady state pressure indicated by the horizontal portion of the plot 502. In contrast, the up-stream gas pressure over time through an FRC assembly according to some embodiments of the present invention (plot 504) appears to almost be a step function with a very fast (e.g., relatively vertical) transition from zero pressure to steady state pressure indicated by the horizontal portion of the plot 504. In some embodiments, steady state pressures may be reached up to about 50% faster, in some cases up to about 75% faster, and in some cases up to about 100% faster with the FRC assembly of the present invention.

Accordingly, while the present invention has been disclosed in connection with example embodiments thereof, it should be understood that other embodiments may fall within the spirit and scope of the invention, as defined by the following claims.

The invention claimed is:

1. A method of controlling gas flow to a semiconductor-processing chamber, the method comprising:
    deactivating ratio setpoint feedback control in a flow ratio controller;
    initiating gas flow through the flow ratio controller;
    moving valves of the flow ratio controller to a preset position based on a stored position when an upstream pressure reaches a stored upstream pressure value, wherein the stored position and the stored upstream pressure value were stored during a prior process run;
    determining that steady state flow ratio controller output flows have been reached; and
    activating ratio setpoint feedback control in the flow ratio controller.

2. The method of claim 1 further comprising:
    setting the valves of the flow ratio controller at an initial start position.

3. The method of claim 1 further comprising:
    storing the current flow ratio controller valve positions after activating ratio setpoint feedback control in the flow ratio controller.

4. The method of claim 1 further comprising:
    storing the current upstream pressure value after activating ratio setpoint feedback control in the flow ratio controller.

5. The method of claim 1 further comprising:
    setting the valves of the flow ratio controller at an initial start position before initiating gas flow through the flow ratio controller;
    storing the current flow ratio controller valve positions after activating ratio setpoint feedback control in the flow ratio controller; and
    storing the current upstream pressure value after activating ratio setpoint feedback control in the flow ratio controller.

6. The method of claim 5 further comprising:
    for each step in an electronic device manufacturing process, repeating:
        deactivating ratio setpoint feedback control in the flow ratio controller;
        setting the valves of the flow ratio controller at a start position before initiating gas flow through the flow ratio controller;
        initiating gas flow through the flow ratio controller;
        moving the valves of the flow ratio controller to a preset position based on a stored position when an upstream pressure reaches a stored upstream pressure value, wherein the stored position and the stored upstream pressure value were stored during a prior process run;
        determining that steady state flow ratio controller output flows have been reached;
        activating ratio setpoint feedback control in the flow ratio controller;

storing the current flow ratio controller valve positions after activating ratio setpoint feedback control in the flow ratio controller; and storing the current upstream pressure value after activating ratio setpoint feedback control in the flow ratio controller.

7. The method of claim 6 further comprising:
for a plurality of electronic device manufacturing process runs, repeating:
for each step in an electronic device manufacturing process run, repeating:
deactivating ratio setpoint feedback control in the flow ratio controller;
setting the valves of the flow ratio controller at a start position before initiating gas flow through the flow ratio controller;
initiating gas flow through the flow ratio controller;
moving the valves of the flow ratio controller to a preset position based on a stored position when an upstream pressure reaches a stored upstream pressure value, wherein the stored position and the stored upstream pressure value were stored during a prior process run;
determining that steady state flow ratio controller output flows have been reached;
activating ratio setpoint feedback control in the flow ratio controller;
storing the current flow ratio controller valve positions after activating ratio setpoint feedback control in the flow ratio controller; and
storing the current upstream pressure value after activating ratio setpoint feedback control in the flow ratio controller.

8. A flow ratio controller assembly comprising:
a controller;
an input gas line;
a pressure sensor coupled to the input gas line and adapted to sense an up-stream gas pressure in the input gas line;
a fan-out manifold having an input coupled to the input gas line and a plurality of outputs;
a plurality of mass flow sensors, each mass flow sensor operatively coupled to a different one of the plurality of outputs of the fan-out manifold and adapted to sense gas flow through a respective output; and
a plurality of adjustable valves, each valve operatively coupled to a different one of the plurality of outputs of the fan-out manifold and adapted to control gas flow through a respective output,
wherein the controller is operatively coupled to the plurality of adjustable valves and adapted to control a position of each of the valves in order to set the valves to a predetermined position based on a stored position followed by activation of ratio setpoint control.

9. The flow ratio controller assembly of claim 8 wherein the controller is further adapted to read and store the up-stream gas pressure sensed by the pressure sensor.

10. The flow ratio controller assembly of claim 8 wherein the controller is further adapted to determine if a steady state gas flow has been achieved.

11. The flow ratio controller assembly of claim 8 wherein the controller is further adapted to operate the flow ratio controller assembly in a feedback mode and a feed forward mode.

12. The flow ratio controller assembly of claim 8 wherein the controller is further adapted to:
deactivate feedback control in the flow ratio controller assembly;
initiate gas flow through the flow ratio controller assembly;
move the adjustable valves of the flow ratio controller assembly to a preset position based on a stored position when a current upstream pressure value reaches a stored upstream pressure value, wherein the stored position and the stored upstream pressure value were stored during a prior process run;
determine that steady state flow ratio controller assembly output flows have been achieved; and
activate ratio setpoint feedback control in the flow ratio controller assembly.

13. The flow ratio controller assembly of claim 12 wherein the controller is further adapted to:
store current flow ratio controller valve positions after activating ratio setpoint feedback control in the flow ratio controller assembly.

14. The flow ratio controller assembly of claim 12 wherein the controller is further adapted to:
store the current upstream pressure value after activating ratio setpoint feedback control in the flow ratio controller assembly.

15. A gas delivery system for one or more processing chambers, the system comprising:
a gas supply panel including a plurality of mass flow controllers;
a flow ratio controller assembly having an input gas line coupled to the gas supply panel, the flow ratio controller assembly including a plurality of output gas lines adapted to be coupled to one or more processing chambers, the flow ratio controller assembly including:
a controller;
a pressure sensor coupled to the input gas line and adapted to sense an up-stream gas pressure in the input gas line;
a fan-out manifold having an input coupled to the input gas line and the plurality of output gas lines;
a plurality of mass flow sensors, each mass flow sensor operatively coupled to a different one of the plurality of output gas lines of the fan-out manifold and adapted to sense gas flow through a respective output gas lines; and
a plurality of adjustable valves, each valve operatively coupled to a different one of the plurality of output gas lines of the fan-out manifold and adapted to control gas flow through a respective output gas line,
wherein the controller is operatively coupled to the plurality of adjustable valves and adapted to control a position of each of the valves in order to set the valves to a predetermined position based on a stored position followed by activation of ratio setpoint control.

16. The gas delivery system of claim 15 wherein the controller is further adapted to read and store the up-stream gas pressure sensed by the pressure sensor.

17. The gas delivery system of claim 15 wherein the controller is further adapted to determine if a steady state gas flow has been achieved.

18. The gas delivery system of claim 15 wherein the controller is further adapted to operate the flow ratio controller assembly in a feedback mode and a feed forward mode.

19. The gas delivery system of claim 15 wherein the controller is further adapted to:
deactivate feedback control in the flow ratio controller assembly;
initiate gas flow through the flow ratio controller assembly;
move the adjustable valves of the flow ratio controller assembly to a preset position based on a stored position when a current upstream pressure value reaches a stored upstream pressure value, wherein the stored position and the stored upstream pressure value were stored during a prior process run;

determine that steady state flow ratio controller assembly output flows have been achieved; and activate ratio setpoint feedback control in the flow ratio controller assembly.

20. The gas delivery system of claim 19 wherein the controller is further adapted to:

store current flow ratio controller valve positions after activating ratio setpoint feedback control in the flow ratio controller assembly; and store the current upstream pressure value after activating ratio setpoint feedback control in the flow ratio controller assembly.

\* \* \* \* \*